United States Patent [19]

Jones, Jr.

[11] Patent Number: 5,214,849
[45] Date of Patent: Jun. 1, 1993

[54] INTEGRATED CIRCUIT REMOVAL APPARATUS

[75] Inventor: Arthur T. Jones, Jr., Boise, Id.
[73] Assignee: Micron Technology, Inc., Boise, Id.
[21] Appl. No.: 962,536
[22] Filed: Oct. 15, 1992
[51] Int. Cl.$^5$ .............................................. B23P 19/04
[52] U.S. Cl. .................................... 29/762; 29/426.3; 29/426.5
[58] Field of Search .............. 29/764, 762, 740, 426.5, 29/426.3

[56] References Cited

U.S. PATENT DOCUMENTS 3,846,895 11/1974 Cosham et al. ...................... 29/764
4,324,040 4/1982 Gottlieb .............................. 29/764 X Primary Examiner—Carl E. Hall
Attorney, Agent, or Firm—Wayne E. Duffy

[57] ABSTRACT

This apparatus provides a means for automatically controlled removal of integrated circuit assemblies from a testing board or other surface where they have been undergoing quality control tests during the IC manufacturing process. The preferred procedure involves passing an inverted standard test board containing a plurality of standard IC assemblies attached thereto, in parallel rows, over a matching array of spring loaded, wedge shaped extraction fingers, which slide into parallel matching slots between the test board sockets and the attached IC assemblies to disengage and separate the IC assemblies from the test board. The loosened assemblies then drop into parallel, matching, down sloping storage reservoirs for transfer to carrier tubes. Misaligned or jammed assemblies displace the spring loaded extraction fingers axially, causing the particular fingers to activate an extraction finger position sensor which then stops the standard mechanical means that moves the test board over the extraction fingers. The displaced fingers are located by visual or other means, the defective assemblies are removed, the fingers return to their original positions and the test board assembly removal process continues to completion.

8 Claims, 4 Drawing Sheets

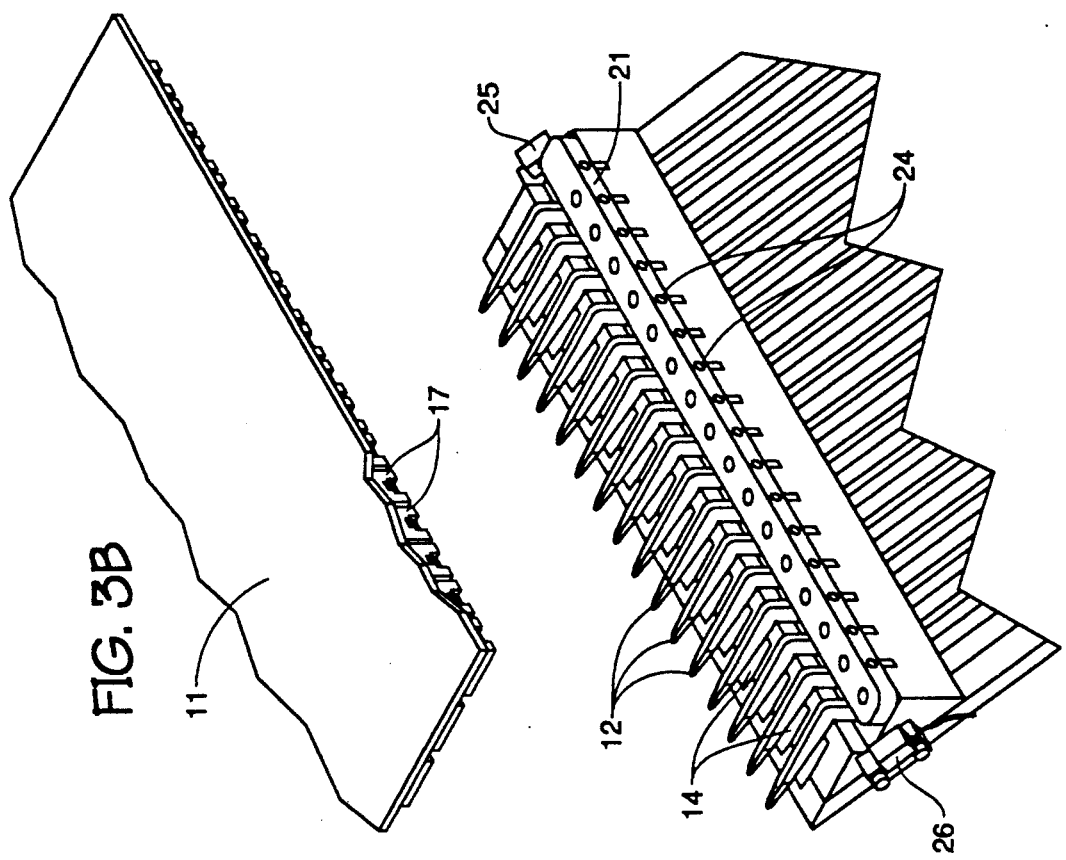
FIG. 4
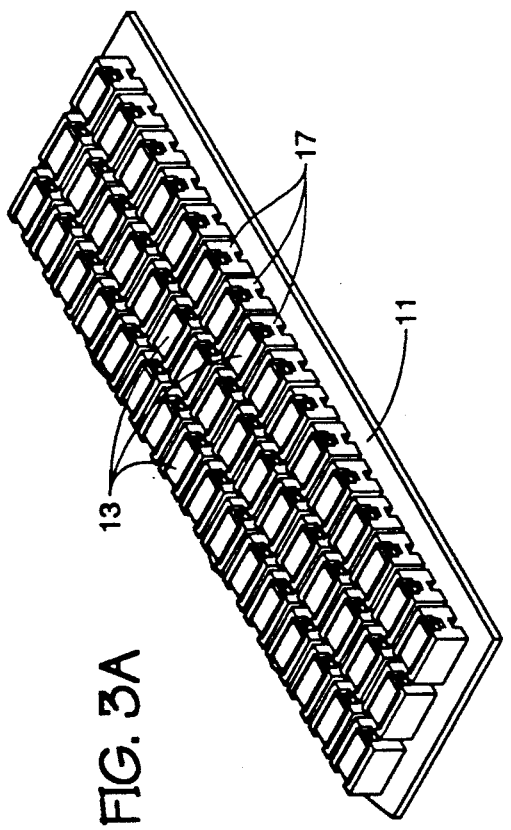
FIG. 3B
FIG. 3A

INTEGRATED CIRCUIT REMOVAL APPARATUS

FIELD OF THE INVENTION

This invention relates to a means for controlled removal of integrated circuit (IC) assemblies from a testing board or other surface wherein they have been undergoing integrity or other quality control tests during the IC manufacturing process.

DESCRIPTION OF PRIOR ART

During the manufacturing of integrated circuit assemblies the devices are commonly tested either individually or in groups for physical and electrical integrity. A standard test for such integrity, usually under extreme conditions, is the burn-in test, involving the imposition of controlled electrical and thermal stresses upon a group of IC assemblies appropriately mounted upon a device under test (DUT) board in a controlled environment. Upon completion of the tests the acceptable IC assemblies are removed individually in some manner and usually are placed in carrier containers for subsequent transfer or storage. The manner of removal of these assemblies from the test board and their handling is the object of this apparatus. The simplicity, speed and safety of the procedure is important to the efficiency and productivity of the overall manufacturing processes. Various devices and mechanisms have been developed within the IC manufacturing industry to accomplish this step in a rapid and orderly way.

One company, Reliability Incorporated of Houston, Tex. has developed equipment for this purpose, called the UNloader (TM), which, in its various models, provides a rapid means for removing IC assemblies from sockets on burn-in boards. The assemblies are disengaged from their sockets in the burn-in boards by a low angle wedge shaped extractor and are held in reservoirs at the base of each extractor until they are released into carrier tubes.

A second IC assembly removal system is manufactured by IDEA Incorporated of Torrance, Calif. This employs an insertion means which uses a finger to fit in the groove in the burn-in socket between the socket and the assembly to allow for perpendicular removal of the assembly.

Neither of the above systems appears to have any automatic system for detecting faulty or jammed IC assemblies or for isolating them from the acceptable assemblies during the process of removal from the testing board.

It is an intent of this apparatus to provide an improved, rapid and automatic means for safe removal of individual assemblies, for automatically detecting and identifying defective or jammed assemblies, for stopping the IC assembly removal process to allow the easy removal of said defective of jammed assemblies and for the automatic loading of acceptable assemblies into suitable carrier tubes.

BRIEF SUMMARY OF THE INVENTION

The integrated circuit removal mechanism to be described in a preferred embodiment, removes IC's which are mounted in appropriate sockets on a device under test (DUT) board, such as a typical burn-in test board. The test board is inverted so that the IC assemblies are on the underside, with the IC leads facing up into the sockets. The inverted board is placed on a movable rack, not shown, which is designed to move the board horizontally and smoothly toward the extraction fingers of the IC removal mechanism. These fingers are held stationary and proximate to the groove in the test board socket so that the wedge shaped end of the extractor can fit in the groove in the socket between the IC assembly and the socket to pry or separate the assembly from the socket and drop it into the down sloping, slot shaped reservoir which stores the assemblies for later transfer to carrier tubes.

If an assembly is jammed into its socket or the socket is misaligned, the involved extraction finger, which is spring loaded to hold it in position while extracting the assemblies, compresses the spring and moves slightly to the rear. When this occurs, the vertical arm of the extraction finger interrupts a light beam which traverses horizontally from one side of the extraction finger to the other, normal to the direction of travel of the finger. The beam sensor on the opposite side of the finger is electrically connected to the driving mechanism (not shown) which moves the test board on the rack above the extracting fingers. The beam interruption causes the rack to stop. The jammed or defective assembly is then removed manually and the compressed spring is released, allow the extraction finger to return to its normal position and the extraction procedure to continue to completion.

The IC removal mechanism can have any number of extraction fingers mounted in planar and parallel spaced relationship to operate simultaneously, on selected configurations of IC testing boards. The traversing light beam can sense any one of the plurality of spring loaded extraction fingers which may be displaced by a jammed or defective IC assembly. The location of the compressed spring and displaced finger can be determined by visual inspection or by incorporation of an electrical or optical or mechanical sensor (not shown), to indicate the jammed assembly and its position on the board. The problem is then remedied by the operator.

DESCRIPTION OF THE DRAWINGS

FIG. 3A, 3B show upright and inverted isometric views of a test board with IC assemblies in leads down and leads up positions.

FIG. 4 shows an isometric view of a plurality of identical extraction fingers, mounted in planar and parallel spaced relationship with a common, horizontally traversing light beam and sensor and arranged to simultaneously extract multiple IC assemblies from a plurality of parallel rows on a common test board.

DESCRIPTION OF THE PREFERRED EMBODIMENT

In the preferred embodiment a common device under test (DUT) board, such as a burn-in test board, is used. This contains a plurality of IC assemblies, removably attached thereto, in a plurality of parallel rows of slots therein and in a leads down position. All IC assemblies are oriented in the same plane and direction in the slots of the test board. The slots are identical in design and are arranged so that the longitudinal axes of the slots and assemblies are parallel and face the same direction on the test board. This is shown in FIG. 3A.

In order to remove the IC assemblies from the test board, the board is inverted, with the IC assemblies now being in a leads up position and still attached to the test board, as shown in FIG. 3B. The test board and the IC assemblies are then placed in a horizontal plane, on a movable rack (not shown), with the long axes of the board slots, IC assemblies and parallel rows all matching the longitudinal axes of the plurality of extraction mechanism fingers, shown isometrically in FIG. 4.

Figure 1B:
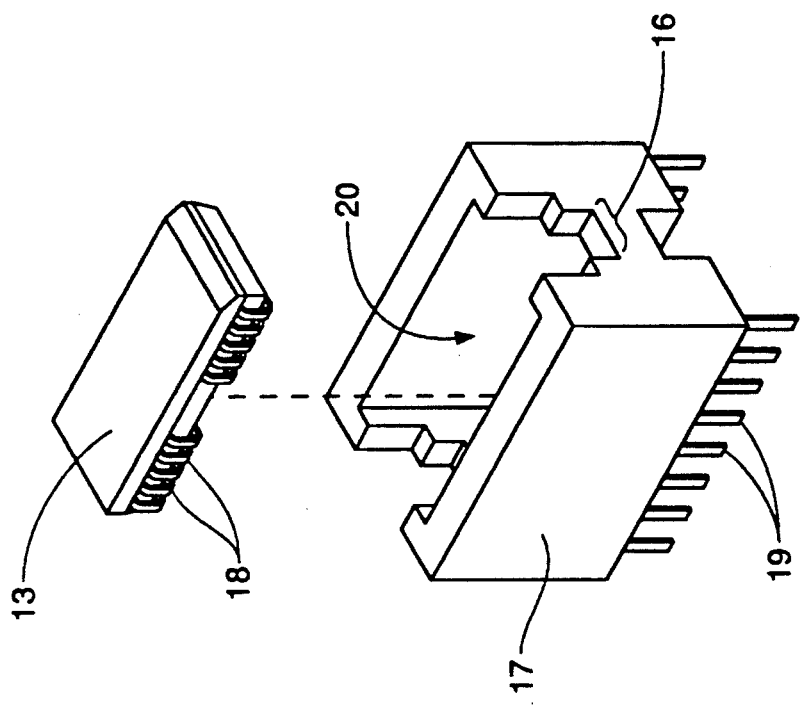
FIG. 1B shows an isometric view of the IC assembly separated from the test board socket.
Figure 1A:
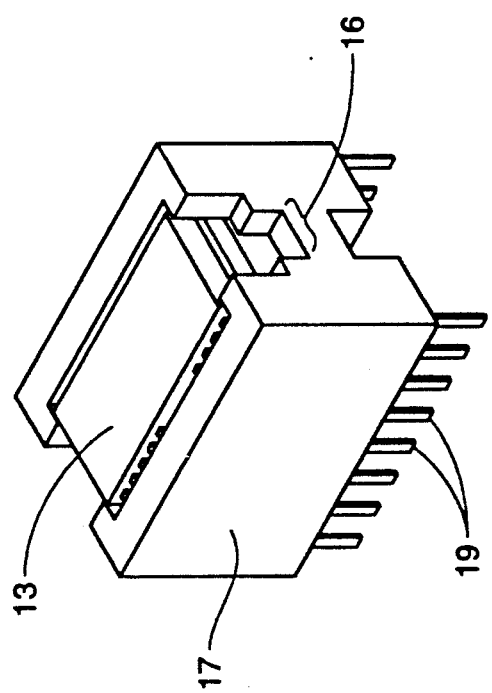
FIG. 1A shows an isometric view of a typical IC assembly, of known design, resting in a leads down position in a typical socket of a standard device under test (DUT) board, such as a burn-in board.
Figure 2A:
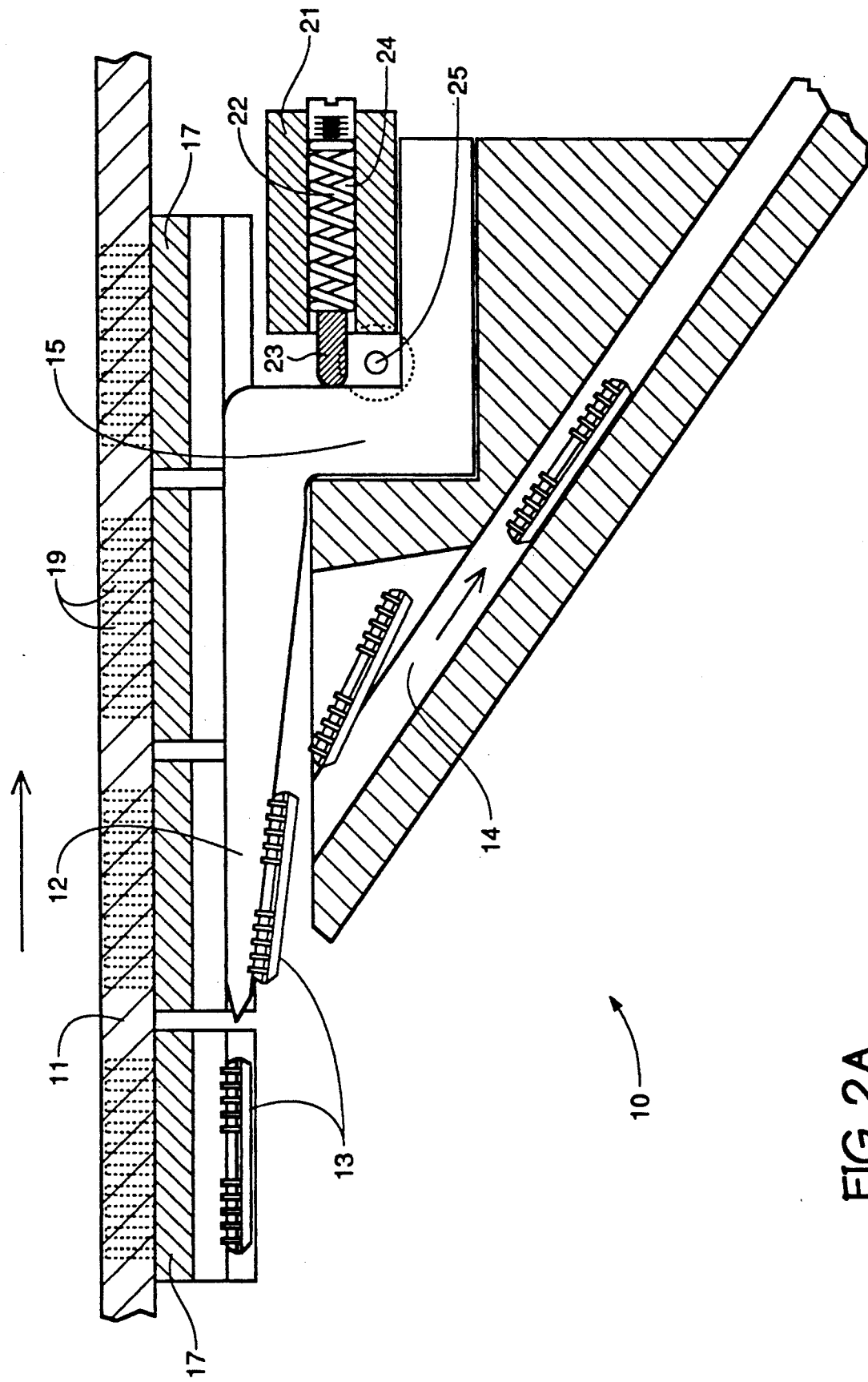
FIG. 2A shows a schematic side view of an inverted test board, holding IC assemblies in a leads up position above an extraction mechanism which is aligned to separate the IC assemblies from the test board and drop them into a down sloping slotted reservoir.

Referring to FIG. 2A, which includes the essential elements of this apparatus, to be described, and designated by the numeral 10, the test board 11, which is shown in an inverted position, is moved by an independently controlled supporting rack (not shown), in a horizontal plane toward the plurality of stationary extraction fingers 12 and carries the attached IC assemblies 13 in a path where they will intersect the wedge shaped fingers 12 and be removed sequentially in each row, to fall into a down sloping slot shaped reservoir 14.

The wedge shaped finger of the extraction means is on one end of a supporting arm 15 having a flat upper surface that is oriented parallel to and in sliding contact with the inverted top of the test board containing the attached IC assemblies in a leads up position. The finger is sufficiently thin to permit the wedge on the end of the finger to slide horizontally into the longitudinal slot 16 in the IC holder 17, between the holder and the bottom surface of the IC assembly and vertically between the parallel rows of up facing leads 18 on opposing parallel sides of the attached IC assemblies. The IC assembly holder 17 appropriately fits the test board 11 and is attached thereto by means of standard electrical leads 19. The IC assembly holder sockets 20 hold, electrically and physically, the IC assemblies under test. The test board, the attached IC assembly holders and the IC assemblies being tested and subsequently removed from the test board are all standard, known, commercially available components and are not a part of this invention.

The extraction finger 12 is shaped in the form of a rectangular "Z", having flat, generally parallel opposing sides and edges, with the angles between central axes of the arms of the finger being ninety degrees. The top, horizontal arm of the finger has a wedge shaped end in which the lower opposing edge of the horizontal arm diverges outwardly and downwardly from the point of the wedge to aid in the downward separation of the IC assembly from the test board socket and passage into the downward sloping slot shaped reservoir 14.

The vertical arm of the finger furnishes support for the finger and the bottom horizontal arm of the finger extends to the rear a short distance into a slotted finger supporting block 21. This block supports the finger, holding the "Z" shape vertical and in an upright position. The leading edge of the vertical arm of the finger is held against a flat surface of the supporting block by means of a spring 22 with a matching pin 23 circumferentially inclosed by said spring and extending from one end of the spring, to bear upon the opposing edge of the vertical arm. The spring is inclosed in an annular pocket 24 which extends horizontally into the body of the supporting block, as shown in FIG. 2A. The spring exerts sufficient force upon the extraction finger to hold it firmly in its forward position against the supporting block during the normal extraction of the IC assembly from the test board socket.

Figure 2B:
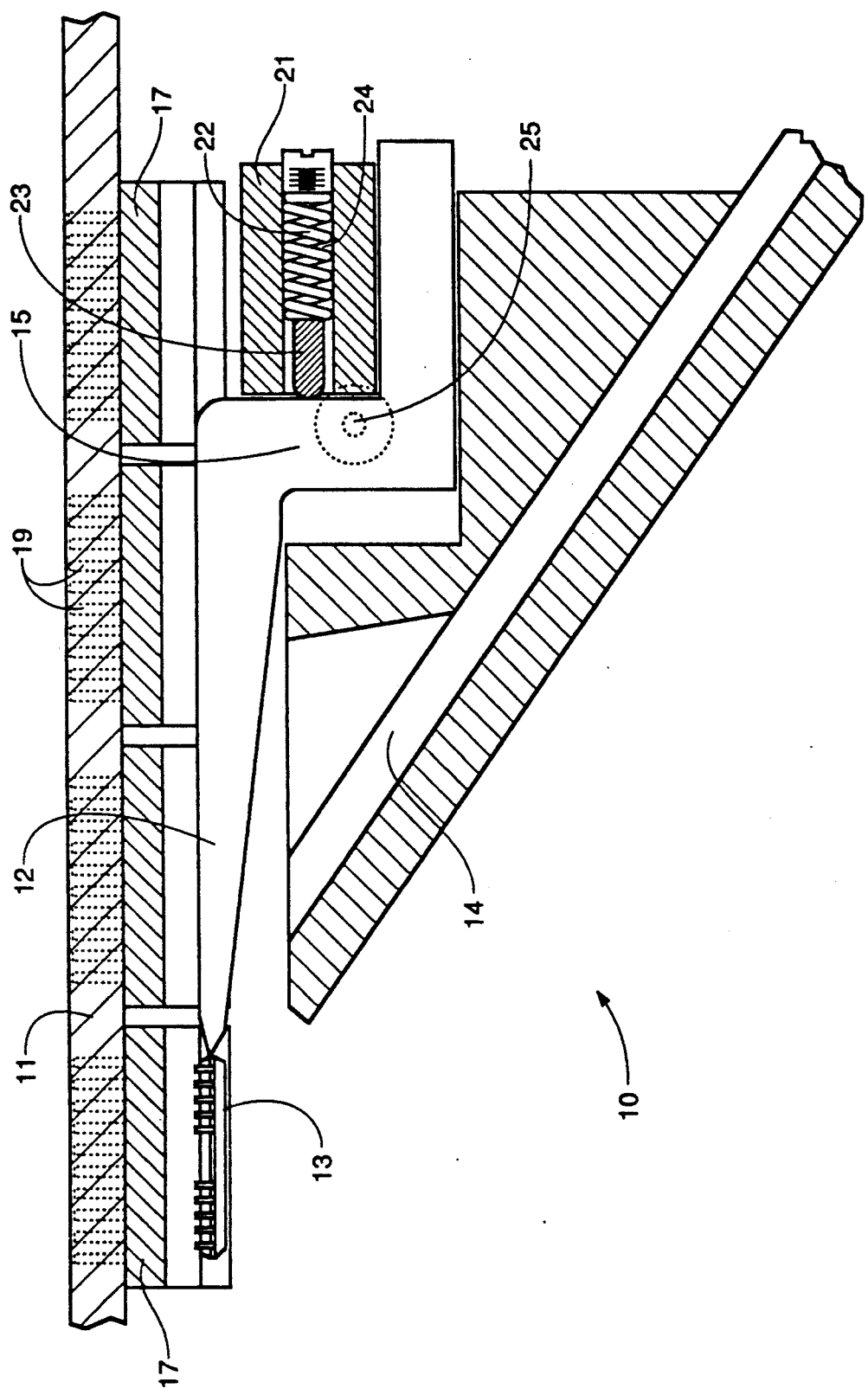
FIG. 2B shows a schematic side view of an extraction finger pressing against a jammed IC assembly and compressing a spring which displaces the finger into the light path of a monitoring beam that causes the test board moving mechanism to stop (not shown).

When the extraction finger encounters a jammed or defective assembly the assembly forces the extraction finger backward, compressing the spring and causing the rear vertical edge of the finger to be displaced to the rear a short distance, as shown in FIG. 2B. The physical displacement of the extraction finger interrupts a light beam which horizontally traverses the width of the extraction finger in a direction normal to that of the horizontal displacement. The light beam source 25 is located on one side of the vertical arm and the beam sensor 26 is located on the opposing side of the arm, as shown in FIG. 4.

When the light beam is interrupted, as shown in FIG. 2B, the sensor, which is electrically connected to the movable rack which moves the test board (not shown), commands the rack to stop. The defective or jammed assembly is removed manually by the operator. The displaced extraction arm returns to its normal position, thus completing the light beam electrical circuit and permitting the assembly extraction procedure to continue to completion.

FIG. 4 shows an array of multiple extraction fingers arranged in parallel spaced relationship to remove a plurality of parallel rows of IC assemblies from an inverted test board. The matching, parallel rows of down sloping, slot shaped storage reservoirs 14, are of existing design, generally accommodating a variety of IC assemblies and handle a finite number of such assemblies, usually approximating the capacity of a standard IC carrier tube. The storage slots are down sloping to permit gravity feeding of the carrier tubes and simplify the separation of the IC assemblies from the test board.

The present invention has been described in a preferred embodiment, using existing IC assemblies, test boards, sockets, board moving mechanism and a special modified extraction finger design to implement the system. Many modifications and variations may become apparent to those skilled in the art. However the scope of the invention is not limited by the above described details but only by the appended claims.

I claim:

1. An apparatus for the continuous, automatic extraction of a plurality of removably attached integrated circuit (IC) assemblies from a plurality of sockets in movable testing boards and other surfaces and for detecting and identifying misaligned and jammed assemblies thereon and for enabling said misaligned and jammed assemblies to be separated from the other assemblies during the assembly extraction process, said apparatus comprising:
   a) a plurality of movable extraction arms, each having a shaped finger on one end and a supporting flange on the opposing end and having leading and following bearing surfaces on said flange;
   b) said fingers being appropriately shaped to insert between the test board sockets and the IC assemblies mounted in parallel spaced rows therein and to extract and separate said assemblies therefrom when the test board carrying said assemblies is moved parallel to and in touching contact with the sockets of the test board;

c) said extraction arm flange being removably mounted and supported and directionally confined, front and rear, by a supporting block which permits limited longitudinal axial movement of the arm;

d) said extraction arm flange being positionally limited on its leading bearing surface by the front confining surface of the supporting block and positionally limited on its following bearing surface by a spring loaded pin removably mounted in the rear confining surface of the supporting block;

e) said spring loaded pin bearing against the following surface of the supporting flange and being able to retract and compress said spring when the extraction arm finger is forced back by a resisting jammed and misaligned IC assembly on the moving test board and to allow limited axial retraction movement of the extraction arm to accommodate the resistance;

f) an appropriate position sensor means to detect the retracted position of the extraction arm which is removably and adjustably mounted on the extraction arm supporting block and connected to the test board moving means in such a way as to immediately stop said test board when the extraction arm is displaced by a jammed and misaligned IC assembly attached thereto;

g) said jammed and misaligned IC assembly is identified, located and removed from the test board and the compressed spring then returns the extraction arm to its normal position;

h) said position sensor then permits normal operation of the test board moving means and the IC extraction procedure to resume and continue to completion.

2. The integrated circuit assembly removal apparatus of claim 1 wherein a plurality of extraction arms are contained, confined and controlled, in parallel spaced relationship, in a common supporting block which is aligned to simultaneously extract matching, parallel rows of IC assemblies from sockets in an IC assembly test board.

3. The integrated circuit assembly removal apparatus of claim 1 wherein the position sensor means senses an optical light beam traversing the path of the retracting extraction arm and, when the beam is interrupted by the arm, electrically causes the test board moving means to stop to allow removal of the jammed IC assembly and electrically allows the test board moving means to operate when the arm returns to its normal operating position.

4. The integrated circuit assembly removal apparatus of claim 1 wherein the position sensor consists of individual electrical contact points located appropriately behind each extraction arm flange which will make electrical contact with a retracting flange and command the test board moving means to stop when a jammed and misaligned IC assembly is encountered by an extraction finger and permit normal operation to resume when the jammed assembly is removed.

5. The integrated circuit assembly removal apparatus of claim 4 wherein the electrical contact sensor located behind each extraction arm is electrically wired to identify the position of that arm and the jammed assembly and to notify the operator thereof.

6. The integrated circuit assembly removal apparatus of claim 1 where the position sensor consists of individual mechanical contact points located appropriately behind each extraction arm flange which will make mechanical contact with any retracting flange and command the test board means to stop when a jammed and misaligned IC assembly is encountered by an extraction finger and permit normal operation to resume when the jammed assembly is removed.

7. The integrated circuit assembly removal apparatus of claim 6 where the mechanical contact sensor located behind each extraction arm mechanically identifies the position of that arm and the jammed assembly and visibly notifies the operator thereof.

8. The integrated circuit assembly removal apparatus of claim 1 wherein the test board containing the removably attached IC assemblies is inverted so that the IC assemblies are in a leads up position and the test board is moved horizontally, proximately and in touching contact with the extraction arm fingers, so that when extracted the IC assemblies fall into suitable reservoirs.

* * * * *